(12) United States Patent
Stevenson et al.

(10) Patent No.: US 8,529,729 B2
(45) Date of Patent: Sep. 10, 2013

(54) PLASMA PROCESSING CHAMBER COMPONENT HAVING ADAPTIVE THERMAL CONDUCTOR

(75) Inventors: Tom Stevenson, Morgan Hill, CA (US); Michael Dickens, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 86 days.

(21) Appl. No.: 12/794,907

(22) Filed: Jun. 7, 2010

(65) Prior Publication Data

US 2011/0300714 A1  Dec. 8, 2011

(51) Int. Cl.
*C23F 1/00* (2006.01)
(52) U.S. Cl.
USPC ............ 156/345.37; 156/345.33; 156/345.51; 438/715
(58) Field of Classification Search
USPC ........ 156/345.33, 37, 47, 52, 345.37, 345.47, 156/345.51, 345.52; 438/706, 714, 715
See application file for complete search history.

(56) References Cited

U.S. PATENT DOCUMENTS

| | | | |
|---|---|---|---|
| 3,994,867 A | 11/1976 | Baughman et al. | |
| 4,237,441 A | 12/1980 | van Konynenburg et al. | |
| 4,304,987 A | 12/1981 | van Konynenburg et al. | |
| 4,361,799 A | 11/1982 | Lutz | |
| 4,518,944 A | 5/1985 | Faris | |
| 4,967,176 A | 10/1990 | Horsma et al. | |
| 5,106,540 A | 4/1992 | Barma et al. | |
| 5,471,035 A | 11/1995 | Holmes | |
| 5,802,856 A | 9/1998 | Schaper et al. | |
| 6,005,232 A | 12/1999 | Janvrin et al. | |
| 6,048,919 A | 4/2000 | McCullough | |
| 6,063,233 A * | 5/2000 | Collins et al. | ............ 156/345.37 |
| 6,229,120 B1 | 5/2001 | Jewell | |
| 6,245,439 B1 | 6/2001 | Yamada et al. | |
| 6,291,568 B1 | 9/2001 | Lussey | |
| 6,332,322 B1 | 12/2001 | Tanaka | |
| 6,356,424 B1 | 3/2002 | Myong et al. | |
| 6,461,801 B1 | 10/2002 | Wang | |
| 6,602,438 B2 | 8/2003 | Lin | |
| 6,776,923 B2 | 8/2004 | Balian et al. | |
| 6,847,014 B1 | 1/2005 | Benjamin et al. | |
| 6,921,724 B2 | 7/2005 | Kamp et al. | |

(Continued)

FOREIGN PATENT DOCUMENTS

| JP | 63-302501 A | 9/1988 |
|---|---|---|
| JP | 9-97830 A | 4/1997 |
| WO | WO 2006/068805 A1 | 6/2006 |

OTHER PUBLICATIONS

Dow Corning Corporation (2007), Product Information, Sylgard® 184 Silicone Elastomer, "Two-part silicone that cures to a flexible elastomer for protection of electrical and electronic devices in solar applications", (3 pages).

(Continued)

*Primary Examiner* — Lan Vinh
(74) *Attorney, Agent, or Firm* — Buchanan Ingersoll & Rooney PC

(57) ABSTRACT

An assembly comprises a component of a plasma process chamber, a thermal source and a polymer composite therebetween exhibiting a phase transition between a high-thermal conductivity phase and a low-thermal conductivity phase. The temperature-induced phase change polymer can be used to maintain the temperature of the component at a high or low temperature during multi-step plasma etching processes.

15 Claims, 7 Drawing Sheets

(56) References Cited

U.S. PATENT DOCUMENTS

| | | |
|---|---|---|
| 7,108,931 B2 | 9/2006 | Muthuswamy et al. |
| 7,645,341 B2 | 1/2010 | Kennedy et al. |
| 2001/0003676 A1* | 6/2001 | Marks et al. ............... 438/710 |
| 2002/0144783 A1* | 10/2002 | Tran et al. ............... 156/345.33 |
| 2005/0211385 A1 | 9/2005 | Benjamin et al. |
| 2007/0228302 A1 | 10/2007 | Norman, Jr. |
| 2008/0090417 A1 | 4/2008 | De La Llera et al. |
| 2008/0308228 A1 | 12/2008 | Stevenson et al. |
| 2008/0308229 A1 | 12/2008 | Patrick et al. |
| 2009/0068356 A1 | 3/2009 | Silvetti et al. |
| 2009/0081878 A1 | 3/2009 | Dhindsa |
| 2009/0305509 A1 | 12/2009 | Stevenson et al. |

OTHER PUBLICATIONS

Tyco Electronics Corporation (2008) "Fundamentals of PolySwitch Overcurrent and Overtemperature Devices", pp. 1-13.

* cited by examiner

PLASMA PROCESSING CHAMBER COMPONENT HAVING ADAPTIVE THERMAL CONDUCTOR

BACKGROUND

With each successive semiconductor technology generation, wafer diameters tend to increase and transistor sizes decrease, resulting in the need for an ever higher degree of accuracy and repeatability in wafer processing. Semiconductor substrate materials, such as silicon wafers, are processed by techniques which include the use of vacuum chambers. These techniques include non plasma applications such as electron beam evaporation, as well as plasma applications, such as sputter deposition, plasma-enhanced chemical vapor deposition (PECVD), resist strip, and plasma etch.

Plasma processing systems available today are among those semiconductor fabrication tools which are subject to an increasing need for improved accuracy, repeatability and efficiency. Success metrics for a plasma processing system include throughput and substrate temperature stability. Substrate temperature affects critical dimensions of devices fabricated on a substrate and thus must not significantly drift when stable substrate temperature is required, e.g. within a step in a processing recipe.

For example, poly-silicon gate etching is driving towards smaller and smaller critical dimension uniformity (CDU) to be achieved across a substrate of about 300 mm in diameter. Such a variation could be due to radial variation in substrate temperature near the edge, plasma chemistry or density, an overhanging edge ring, or other constraints. The CDU requirements are expected to become more stringent with the continuing reduction in node size.

Fabrication of an integrated circuit chip typically begins with a thin, polished slice of high-purity, single crystal semiconductor material substrate (such as silicon or germanium). Each substrate is subjected to a sequence of physical and chemical processing steps that form the various circuit structures on the substrate. During the fabrication process, various types of thin films may be deposited on the substrate using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor substrate, the unique electrical properties of semiconductors are produced by substituting selected impurities into the semiconductor crystal lattice using a process called doping. The doped silicon substrate may then be uniformly coated with a thin layer of photosensitive, or radiation sensitive material, called a "resist". Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the substrate through a process known as etching. A plasma process chamber is generally used for etching substrates by supplying a process gas to the plasma process chamber and application of a radio frequency (RF) field to the process gas to energize the process gas into a plasma state.

SUMMARY

An assembly comprising a component of a plasma process chamber, a thermal source and a polymer composite sandwiched between the component and the thermal source, the component having a temperature controlled surface, wherein the polymer composite exhibits a temperature-induced phase transition between a phase with high thermal conductivity and a phase with low thermal conductivity.

In a method of controlling temperature of a component of a plasma process chamber in which semiconductor substrates are processed, using a polymer composite exhibiting a temperature-induced phase transition between a phase with high thermal conductivity and a phase with low thermal conductivity, wherein the component has a temperature controlled surface and the polymer composite is sandwiched between the component and a thermal source, the method comprises: inducing the phase transition of the polymer composite to thermally isolate the component from the thermal source or to thermally couple the component to the thermal source.

In a method of etching a substrate in a plasma process chamber comprising the assembly above, the method comprises: etching the substrate at a first temperature and a first plasma power; inducing the temperature-induced phase transition of the polymer composite; etching the substrate at a second temperature and a second plasma power; wherein the first temperature is higher than the second temperature and the first plasma power is lower than the second plasma power, or wherein the first temperature is lower than the second temperature and the first plasma power is higher than the second plasma power.

DETAILED DESCRIPTION

Figure 1A:
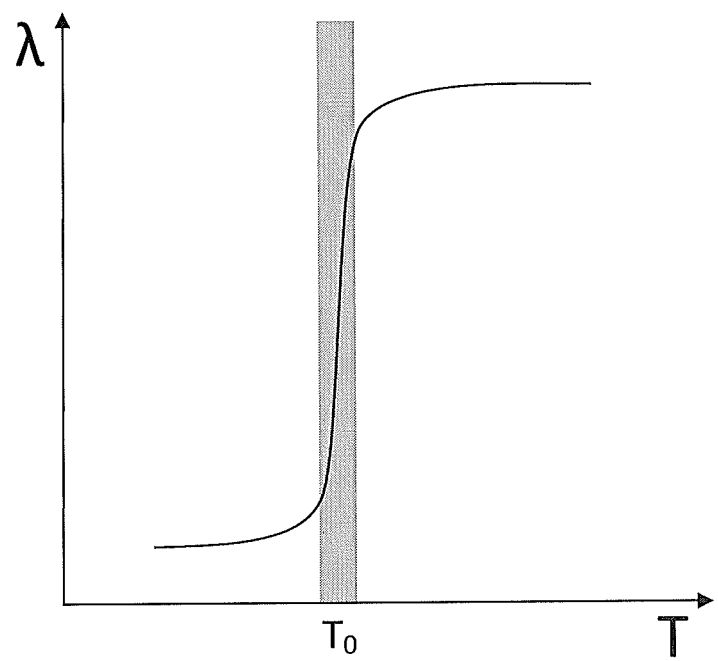
FIG. 1A shows an exemplary temperature dependence of thermal conductivity of a polymeric positive temperature coefficient (PPTC) composite.

A plasma process chamber can comprise a vacuum chamber with an upper electrode assembly and a substrate support assembly. A semiconductor substrate to be processed is covered by a suitable mask and placed directly on the substrate support assembly. A chamber with gases such as $O_2$, $N_2$, He, Ar or mixtures thereof. The chamber is maintained at a pressure typically in the millitorr range. The upper electrode assembly is provided with gas injection hole(s), which permit the gas to be uniformly dispersed through the upper electrode assembly into the chamber. One or more radio-frequency (RF) power supplies transmit RF power into the vacuum chamber and dissociate neutral process gas molecules into a plasma. Highly reactive radicals in the plasma are forced towards the substrate surface by an electrical field between the upper electrode and the substrate support assembly. The surface of the substrate is etched by chemical reaction with the radicals.

The substrate support assembly can comprise a substrate support plate, an electric heater in direct thermal contact (e.g. embedded or attached) with the substrate support plate. A fluid-cooled plate can be attached to the bottom of the substrate support plate. Fluid circulating in channels in the fluid-cooled plate transfers heat away from the substrate support assembly. An exemplary substrate support assembly is described in commonly assigned U.S. Pat. Nos. 6,847,014 and 6,921,724, which are hereby incorporated by reference.

The upper electrode assembly can include an upper electrode attached to a backing plate. An exemplary upper electrode assembly can be found in commonly-assigned U.S. Patent Publication Nos. 2008/0308228, 2008/0090417, 2008/0308229, 2009/0305509 and 2009/0081878, and U.S. Pat. No. 7,645,341, each of which is incorporated herein by reference. The backing plate is attached to a fluid-cooled top plate. The upper electrode can be heated by the plasma and/or a heater arrangement embedded in the upper electrode assembly.

Thermal management is a challenge in a plasma process chamber wherein high-powered plasma is used to process semiconductor substrates. For example, in a process for manufacturing memory chips, the plasma power required in dielectric etch chambers can exceed 6 kilowatts. Thermal management is further complicated by the necessity of dramatically changing the plasma power and the substrate temperature while maintaining temperatures of chamber components relatively stable (e.g. electrodes, backing plate, edge ring, chamber wall, etc.) between different processing steps.

For example, an exemplary plasma etch process, in which high aspect ratio features are etched, includes a main etch step during which the semiconductor substrate is etched, and a mask opening step during which part of the mask is etched. The main etch step requires a high plasma power, which can cause high heat flux (e.g. about 4000 W) into the substrate, and a low substrate temperature (about 20-40° C.) to produce desired feature profiles, while the mask opening steps requires a low plasma power, which can cause low heat flux (e.g. about 400 W) into the substrate, and a high substrate temperature (about 70-110° C.). To achieve the desired wafer temperature, high watt density heaters above a temperature controlled cold plate are used to maintain high wafer temperature in a low power step and the heaters are turned off or run at low power to allow the wafer to be cooled by the cold plate in a high power step. The temperature of an edge ring and/or an upper electrode is desirably kept stable during the entire process despite varying heating caused by different plasma power settings during different steps.

The main etch step requires high cooling power from the fluid-cooled plate to cool the substrate to the required low temperature while it is preferred in the mask opening step that the cooling power from the fluid-cooled plate is low in order to obtain the required high substrate temperature. However, in a conventional plasma process chamber, the volume of the fluid circulating in the fluid-cooled plate is large and thus changing the fluid temperature or the cooling power is very slow compared to the time scale of the etch steps. As a result, in the mask opening step, an electric heater arrangement is conventionally used to output enough heating power to compensate for the high cooling power of the fluid-cooled plate in order to heat the substrate to the required high temperature. Therefore, the heater must have very high power (e.g. 5000 W or more), which can cause temperature non-uniformity and such high power heaters add variability to chuck manufacturing. Another conventional approach is to use two temperature control units to selectively pump hot or cold fluid as needed through a substrate support. However, such approach adds complexity to the substrate support design.

Described herein is an assembly which includes a polymer-based composite that exhibits a temperature-induced phase transition between a phase with high thermal conductivity and a phase with low thermal conductivity, as thermal transfer media for plasma chamber components having a temperature controlled surface preferably exposed in an interior of a plasma process chamber, such as a substrate support assembly, an upper electrode assembly, an edge ring, an edge ring assembly or other chamber components in the plasma process chamber. When incorporated in a substrate support having a resistance heater, it is possible to increase the process window without increasing the heater power density which is desirable in terms of reducing power consumption and reducing manufacturing variability.

A group of polymer-based composites exhibit a dramatic increase or decrease in their thermal conductivities across narrow temperature ranges (i.e. a phase transition). FIG. 1A shows thermal conductivity ($\lambda$) as a function of temperature (T) of an exemplary polymer-based composite. Below a characteristic temperature $T_0$, $\lambda$ is relative small. As T is increased across a narrow temperature range around $T_0$, $\lambda$ exhibits a sharp increase, by several folds or even by orders of magnitude. As T is increased beyond the narrow temperature range around $T_0$, $\lambda$ stabilizes at a relatively large value. Such composites are referred to as polymeric positive temperature coefficient composites, or PPTC composites.

Figure 1B:
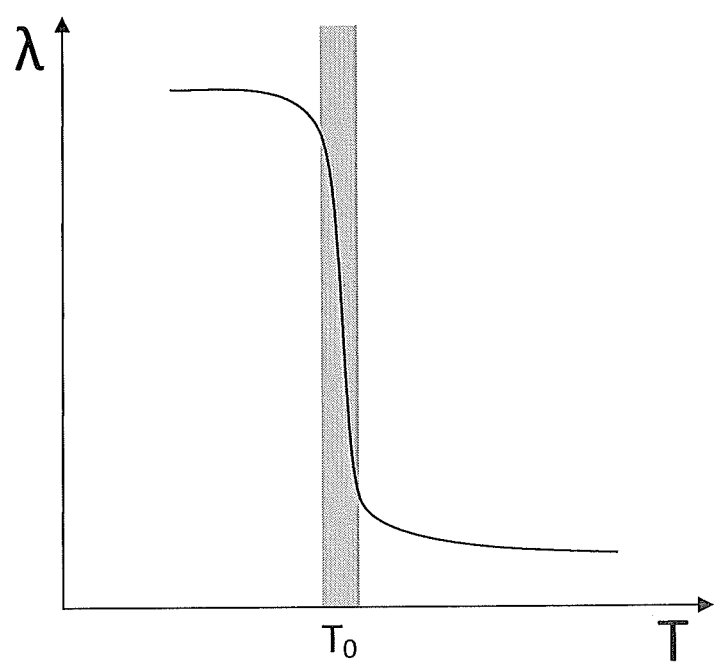
FIG. 1B shows an exemplary temperature dependence of thermal conductivity of a polymeric negative temperature coefficient (PNTC) composite.

FIG. 1B shows a thermal conductivity ($\lambda$) as a function of temperature (T) of another exemplary polymer-based composite. Below a characteristic temperature $T_0$, A is relative large. As T is increased across a narrow temperature range around $T_0$, $\lambda$ exhibits a sharp decrease, by several folds or even by orders of magnitude. As T is increased beyond the narrow temperature range around $T_0$, $\lambda$ stabilizes at a relatively low value. Such composites are referred to as polymeric negative temperature coefficient composites, or PNTC composites.

PPTC and PNTC composites may be prepared by any suitable methods. One embodiment is mixing a filler material (e.g. metal, carbon, etc.) with high $\lambda$, in a form of fibers or powders, into a polymer matrix with low $\lambda$.

Figure 2A:
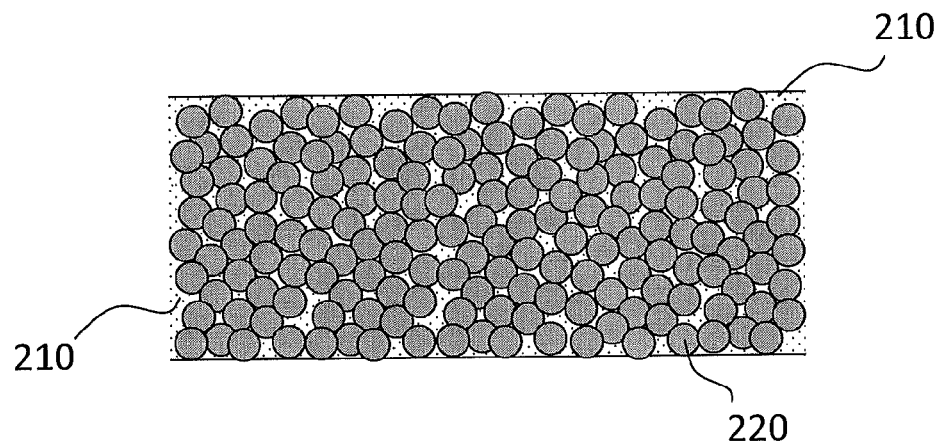
FIG. 2A shows a schematic of the structure of an exemplary PNTC composite below its characteristic temperature $T_0$.
Figure 2B:
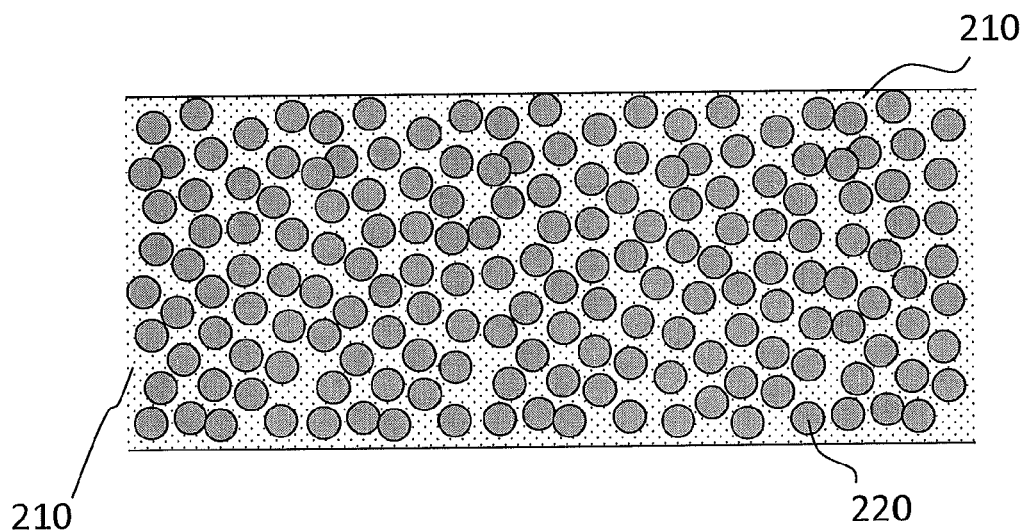
FIG. 2B shows a schematic of the structure of an exemplary PNTC composite above its characteristic temperature $T_0$.

Specifically, to implement a PNTC composite, a polymer matrix 210 that has low $\lambda$ and expands with increasing T can be used. See FIGS. 2A and 2B. A suitable amount of the filler material 220 with high $\lambda$ is thoroughly mixed into the polymer matrix 210, such that the loading level of the filler material 220 is above the percolation threshold at temperatures below $T_0$ and the high $\lambda$ of the filler material 220 dominates the overall $\lambda$ of the composite; and that as T increases and approaches $T_0$, expansion of the polymer matrix 210 effectively decreases the loading level; and that as T increases beyond $T_0$, the loading level drops below the percolation threshold and the low $\lambda$ of the polymer matrix 210 dominates the overall of the composite. The polymer matrix 210 can be any suitable polymer, for example, highly chain-aligned polyacetylenes obtained by solid-state polymerization of cyclic or acyclic acetylene monomers containing two or more conjugated acetylene groups per monomer molecule, as described in U.S. Pat. No. 3,994,867, hereby incorporated by reference.

Figure 2C:
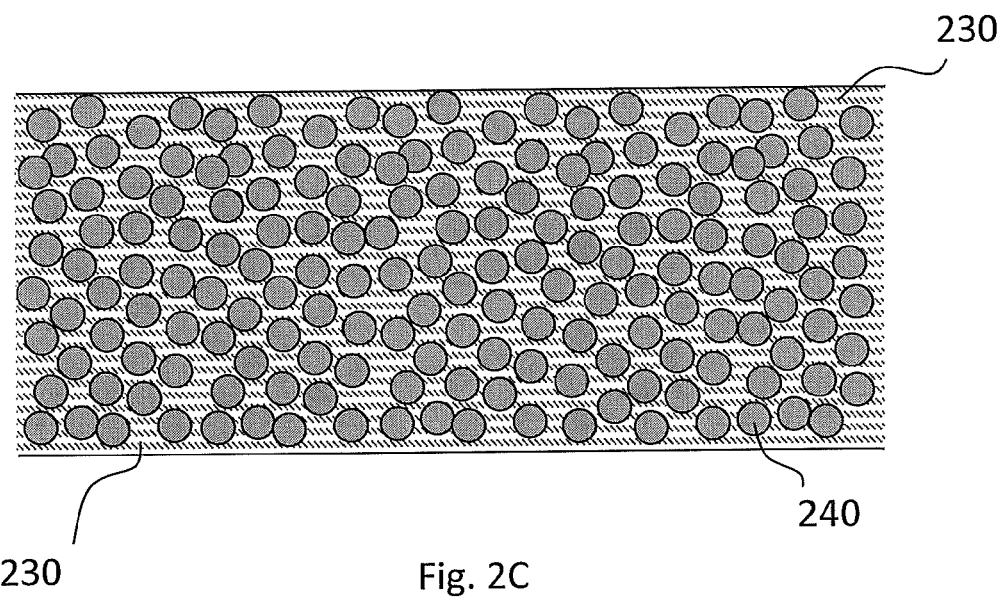
FIG. 2C shows a schematic of the structure of an exemplary PPTC composite below its characteristic temperature $T_0$.
Figure 2D:
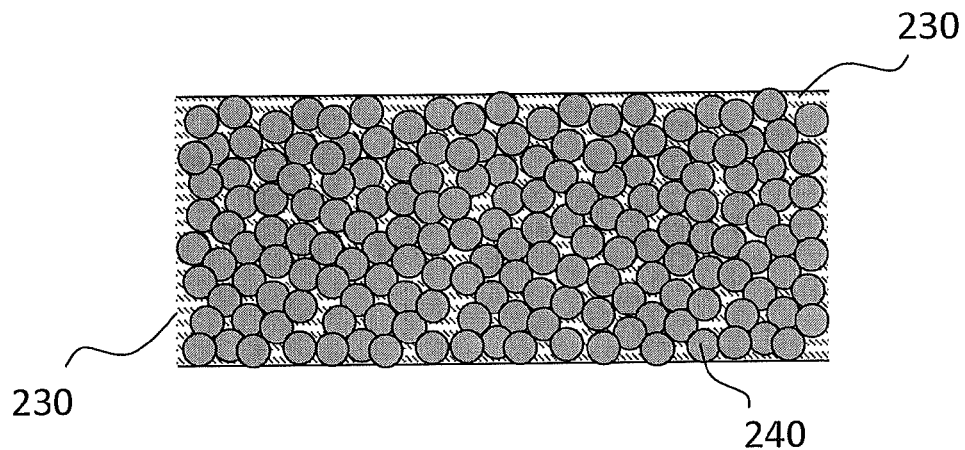
FIG. 2D shows a schematic of the structure of an exemplary PPTC composite above its characteristic temperature $T_0$.

To implement a PPTC composite, a polymer matrix 230 that has a low λ and expands with increasing T can be used. See FIGS. 2C and 2D. A suitable amount of the filler material with high λ 240 is thoroughly mixed into the polymer matrix 230, such that the loading level of the filler material 240 is above the percolation threshold at temperatures above $T_0$ and the high λ of the filler material 240 dominates the overall λ of the composite; and that as T decreases and approaches $T_0$, expansion of the polymer matrix 230 effectively decreases the loading level; and that as T decreases beyond $T_0$, the loading level drops below the percolation threshold and the low λ of the polymer matrix 230 dominates the overall λ of the composite. The polymer matrix 230 can be any suitable polymer, for example, Dow Corning Sylgard® 184 silicone elastomer.

Figure 3A:
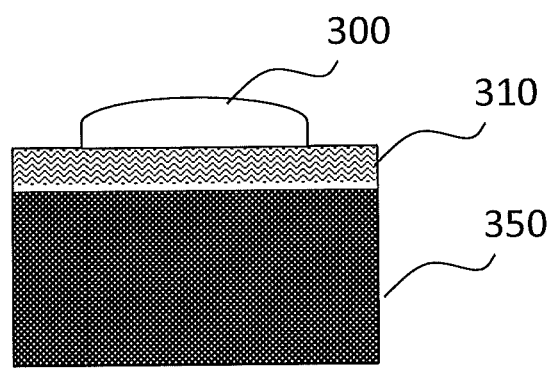
FIG. 3A is a schematic of a use of a PNTC composite.

PPTC or PNTC composites can be used as heat transfer media (e.g. thermal gaskets) between a plasma chamber component whose temperature is to be controlled, and a thermal source such as a heat source and/or a heat sink. For example, as shown in FIG. 3A, a PNTC composite layer 310 is sandwiched between a component 300 and a heat source 350. The PNTC composite layer 310 functions as a temperature limiter in that the component 300 is substantially thermally isolated from the heat source 350 when the temperature of the PNTC composite layer 310 is above $T_0$. The temperature of the PNTC composite layer 310 can be controlled by the heat source 350 and/or heat flux through the component 300. The PNTC composite layer 310 in this configuration can be used to protect the component 300 from overheating.

Figure 3B:
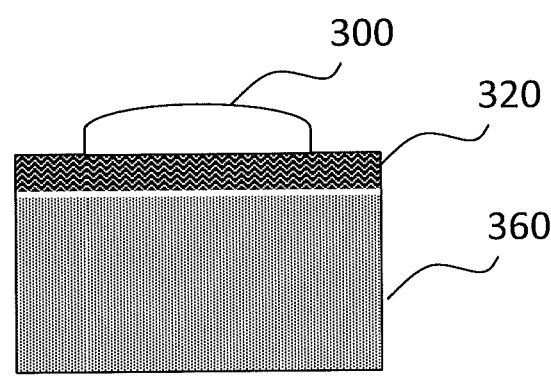
FIG. 3B is a schematic of a use of a PPTC composite.

Likewise, as shown in FIG. 3B, a PPTC composite layer 320 is sandwiched between the component 300 and a heat sink 360. The PPTC composite layer 320 functions as a temperature limiter in that the component 300 is substantially thermally isolated from the heat sink 360 when the temperature of the composite layer 320 is below $T_0$. The temperature of the PPTC composite layer 320 can be controlled by the heat sink 360 and/or heat flux through the component 300. The PPTC composite layer 320 in this configuration can be used to protect the component 300 from overcooling.

The thermal source can be a resistance heater or heaters and/or one or more temperature control units (TCU) circulating liquid in flow channels. For example, a dual chiller approach where two TCU's circulating hot (e.g. 70° C.) and cold (e.g., −20° C.) liquid can be used to raise or lower the temperature of the PPTC or PNTC polymer.

Some applications require the temperature of the component 300 switched between a higher temperature $T_H$ and a lower temperature $T_L$. This can be achieved by stacking the heat source 350 on the heat sink 360 and positioning the component 300 in direct thermal contact with the heat source 350. The heat source 350 can be an electrical heater and the heat sink 360 can be a cooling plate in which temperature controlled liquid is circulated. If a PPTC composite layer is not used between the heat source 350 and the heat sink 360, the heat source 350 must output enough heating power to compensate for heat loss to the heat sink 360 and heat loss to the environment in order to maintain the component 300 at $T_H$. If a PNTC composite layer 310 is sandwiched between the heat source 350 and the heat sink 360 as shown in FIG. 3C, wherein the λ of the PNTC composite layer 310 is low at $T_H$ and high at $T_L$, the heat sink 360 is substantially thermally isolated from the component 300 and the heat source 350 when the temperature of the component 300 is at $T_H$, therefore the heat source 350 primarily outputs heating power sufficient to compensate for heat loss to the environment.

The phases of the PNTC composite layer 310 can be controlled by the heat source 350, the heat sink 360 and/or heat flux through the component 300. For example, (a) if the temperature of the component 300 is to be raised from $T_L$ to $T_H$, the heat source 350 can initially output a high heating power to overcome heat loss to the heat sink 360 and induce the PNTC composite layer 310 through its phase transition to its low thermal conductivity phase, which thermally isolates the heat source 350 and the component 300 from the heat sink 360. The heat source 350 can then reduce its heating power to maintain the component 300 at $T_H$; (b) if the temperature of the component 300 is to be lowered from $T_H$ to $T_L$, the heat source 350 can be turned off and allow the PNTC composite layer 310 to cool. Once the PNTC composite layer 310 goes through its phase transition to its high thermal conductivity phase, the heat sink 360 can then quickly draw heat from the component 300 and reduce the temperature of the component 300 to $T_L$. Alternatively, the heat sink 360 can initially lower its temperature below $T_L$ by running colder coolant therethrough to induce the phase transition of the PNTC composite layer 310 to its high thermal conductivity phase, and the heat sink 360 can then adjust its temperature to maintain the component 300 at $T_L$.

Figure 3C:
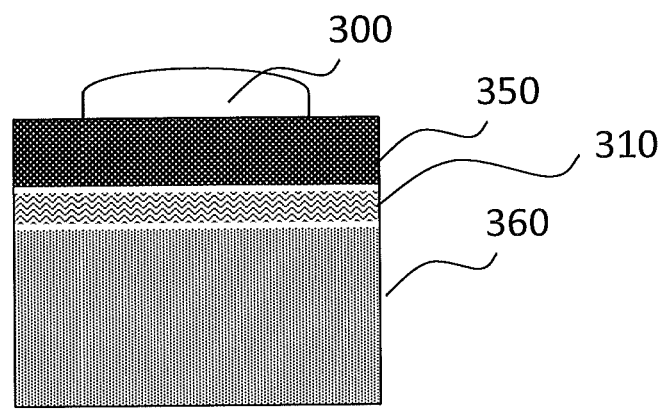
FIG. 3C is a schematic of another use of a PNTC composite.

The configurations shown in FIGS. 3A-3C can be combined in any suitable manner.

Figure 4:
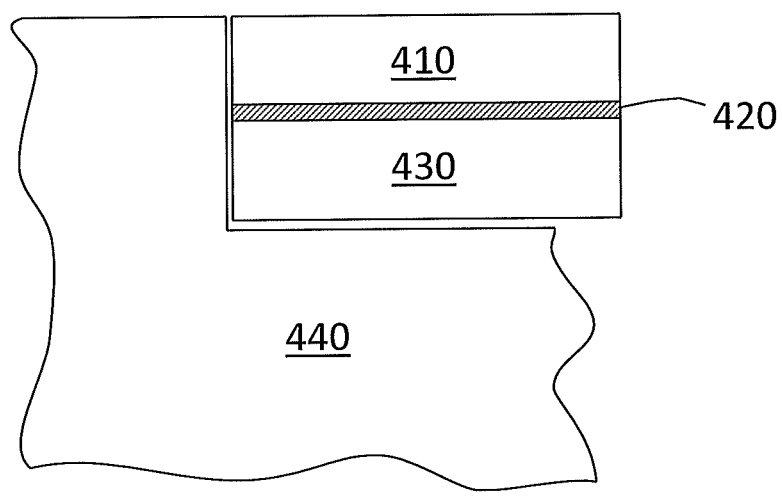
FIG. 4 shows a schematic cross section of an edge ring assembly of a plasma process chamber wherein semiconductor substrates are processed wherein a PPTC composite is used.

FIG. 4 shows an exemplary use of a PPTC composite layer 420 between a component comprising an edge ring 410 and a support ring 430, both rings configured to surround a substrate support assembly 440 in a plasma process chamber. The edge ring 410 is preferably maintained at a constant temperature during an etch process. The edge ring 410 is heated by plasma in the plasma process chamber during use. The support ring 430 is configured to function as a heat sink and remove heat from the edge ring 410. Variation of plasma power required in different etching steps can cause variation of heating power on the edge ring 410. When the plasma power is high, the PPTC composite layer 420 sandwiched between the edge ring 410 and the support ring 430 can be heated by heat flux from the plasma through the edge ring 410 to its high thermal conductivity state and then heat is removed efficiently through the PPTC composite layer 420 from the edge ring 410 to the support ring 430. The edge ring 410 is thus protected from overheating. When the plasma power is low, the PPTC composite layer 420 can be cooled to its low thermal conductivity state by the support ring 430 and thermally isolate the edge ring 410 from the support ring 430. The edge ring 410 is thus protected from overcooling. Compared to using a material whose thermal conductivity does not change as significantly as the PPTC composite between the edge ring 410 and the support ring 430, temperature variation of the edge ring 410 caused by variation of plasma heating power can be reduced. Alternatively, the edge ring 410 can be an edge ring assembly comprising an edge ring and a heater ring in direct thermal contact with the edge ring.

Figure 5:
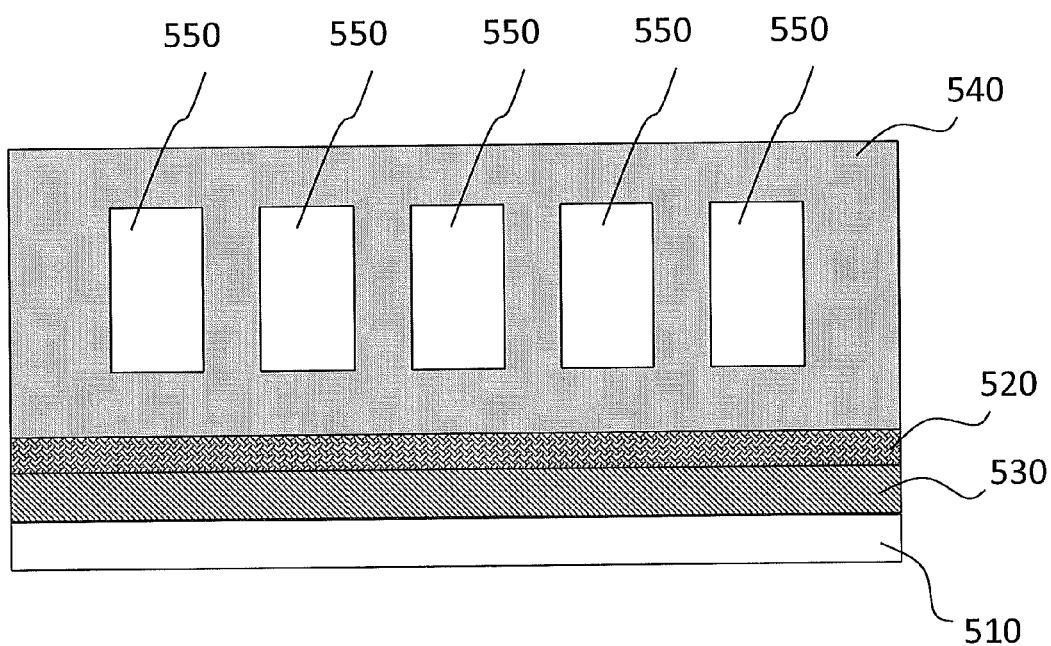
FIG. 5 shows a schematic cross section of an upper electrode assembly of a plasma chamber wherein semiconductor substrates are processed wherein a PPTC composite is used.

FIG. 5 shows another exemplary use of a PPTC composite layer 520 in an upper electrode assembly in a plasma process chamber, wherein the component comprises an upper electrode 510 attached to a backing plate 530. The backing plate 530 is attached to a fluid-cooled plate 540 with the PPTC composite layer 520 sandwiched therebetween. The fluid-cooled plate 540 has channels 545 in which cooling fluid circulates and transfers heat away from the upper electrode assembly. The upper electrode 510 is preferably maintained at a constant temperature during an entire etch process. However, the upper electrode 510 can be heated by plasma in the plasma process chamber and/or a heater (not shown) embedded in the upper electrode assembly during use. Variation of plasma power required in different etch steps can cause variation of the heat received by the upper electrode 510. When the plasma power is high, the PPTC composite layer 520 sandwiched between the backing plate 530 and the fluid-cooled plate 540 has high thermal conductivity and heat is efficiently transferred from the upper electrode 510 through the backing plate 530 and the PPTC composite layer 520 to the fluid-cooled plate 540. The upper electrode 510 is thus protected from overheating. The PPTC composite 520 has low thermal conductivity when the plasma power is low and the backing plate 530 is substantially thermally isolated from the fluid-cooled plate 540 by the PPTC composite layer 520. The upper electrode 510 is thus protected from overcooling. Alternatively, the phase and thermal conductivity of the PPTC composite layer 520 can be controlled by a thermal source such as a heater embedded in the upper electrode assembly. Compared to using a material without a phase transition, using the PPTC composite between the backing plate 530 and the fluid-cooled plate 540 can reduce temperature variation caused by variation of plasma power.

Figure 6:
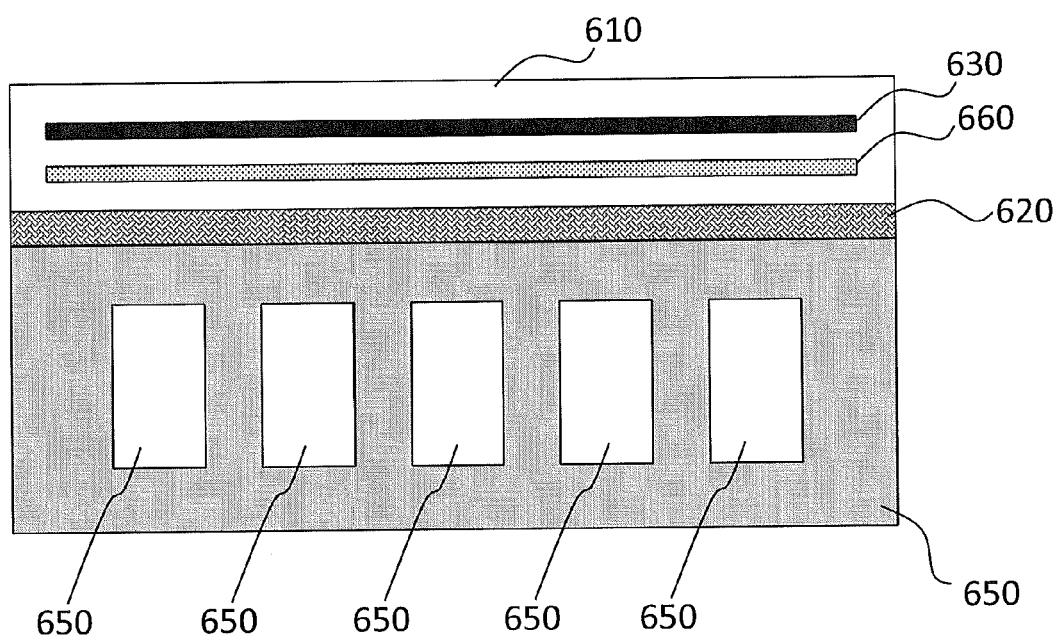
FIG. 6 shows a schematic cross section of a substrate support assembly of a plasma process chamber wherein semiconductor substrates are processed wherein a PNTC composite is used.

FIG. 6 shows an exemplary use of a PNTC composite layer 620 wherein the component comprises a substrate support assembly 600 in a plasma process chamber. The substrate support assembly 600 can comprise a substrate support layer 610 with an electrode 630 embedded therein for electrostatically clamping a substrate on an upper surface of the substrate support layer 610. The substrate support assembly 600 can further have a heater plate 660 embedded therein or attached thereto. The substrate support assembly 600 is attached to a fluid-cooled plate 640 with a layer of the PNTC composite layer 620 sandwiched therebetween. The fluid-cooled plate 640 has channels 645 in which cooling fluid circulates and transfers heat away from the substrate support assembly. In an etch step wherein a high substrate temperature is desired, the heater plate 660 heats the substrate and the PNTC composite layer 620. As the temperature of the PNTC composite layer 620 increases above $T_0$, $\lambda$ of the PNTC composite layer 620 drops sharply, which substantially thermally isolates the substrate support layer 610 from the fluid-cooled plate 640. Heating power of the heater plate 660 can then be reduced to maintain the high substrate temperature. In an etch step wherein a low substrate temperature is desired, the heater plate 660 shuts off and temperatures of the substrate and the PNTC composite layer 620 decrease. As the temperature of the PNTC composite layer 620 decreases below $T_0$, A of the PNTC composite layer 620 rises sharply, which substantially thermally couples the substrate support layer 610 to the fluid-cooled plate 640 for efficient cooling. Alternatively, temperature of the fluid-cooled plate 640 can be used to control the phases of the PNTC composite layer 620 by flowing a fluid above $T_0$ or a fluid below $T_0$ through the channels 645 from two recirculators.

The PPTC and PNTC composite layers are preferably from 0.2 to 2 mm thick.

As an example, a two step plasma etch can use the phase change polymer in a wafer chuck as a bond layer between a heater plate and a cold plate. The first step can be a high power step wherein the cold plate is maintained at −20° C., the heater is turned off and plasma is generated using 8000 W total power. The second step can be a low power step wherein the cold plate is maintained at 20° C., the heater is run at 3000 W and plasma is generated using 400 W. The polymer can be in a high thermal conductivity state during the high power step to enhance cooling of the wafer and in a low thermal conductivity state during the low power step to enhance heating of the wafer.

While the uses of PNTC and PPTC composites have been described in detail with reference to specific embodiments thereof, it will be apparent to those skilled in the art that various changes and modifications can be made, and equivalents employed, without departing from the scope of the appended claims.

We claim:

1. An assembly comprising a component of a plasma process chamber, a thermal source and a polymer composite sandwiched between the component and the thermal source, the component having a temperature controlled surface, wherein:
the polymer composite exhibits a temperature-induced phase transition between a high thermal conductivity phase and a low thermal conductivity phase.

2. The assembly of claim 1, wherein the polymer composite exhibits a temperature-induced phase transition from the low thermal conductivity phase to the high thermal conductivity phase when the temperature of the polymer composite increases above a transition temperature.

3. The assembly of claim 1, wherein the polymer composite exhibits a temperature-induced phase transition from the low thermal conductivity phase to the high thermal conductivity phase when the temperature of the polymer composite decreases below a transition temperature.

4. The assembly of claim 1, wherein the thermal source is a fluid-cooled plate or an electric heater.

5. The assembly of claim 1, wherein the polymer composite is adapted to substantially thermally isolate the component from the thermal source when the polymer composite is in the low thermal conductivity phase, and substantially thermally couple the component to the thermal source when the polymer composite is in the high thermal conductivity phase.

6. The assembly of claim 1, wherein the temperature controlled surface is exposed in an interior of the plasma process chamber.

7. A method of making the assembly of claim 1, comprising sandwiching the polymer composite between the temperature controlled surface of the component and the thermal source.

8. The assembly of claim 1, wherein the thermal source is a heat source.

9. The assembly of claim 8, wherein the component is selected from the group consisting of an upper electrode, a backing plate, a chamber wall, an edge ring and a substrate support plate.

10. The assembly of claim 1, wherein the thermal source is a heat sink.

11. The assembly of claim 10, wherein the component is selected from the group consisting of an upper electrode, a backing plate, a chamber wall, an edge ring, a substrate support plate, a substrate support assembly including a substrate support plate and an electric heater in direct thermal contact with the substrate support plate, and an edge ring assembly including an edge ring and a heater ring in direct thermal contact with the edge ring.

12. A method of plasma etching a substrate in a plasma process chamber comprising the assembly of claim 1, the method comprising:
(a) etching the substrate at a first temperature and a first plasma power;
(b) inducing the phase transition of the polymer composite from the low thermal conductivity phase to the high thermal conductivity or from the high thermal conductivity phase to the low thermal conductivity phase;

(c) etching the substrate at a second temperature and a second plasma power;

wherein the first temperature is higher than the second temperature and the first plasma power is lower than the second plasma power or the first temperature is lower than the second temperature and the first plasma power is higher than the second plasma power.

13. The method of claim 12, wherein:

the component is a substrate support assembly including a substrate support layer on which the substrate is supported during etching and an electric heater in direct thermal contact with the substrate support layer;

the thermal source is a heat sink;

the electric heater heats the substrate support and maintains the polymer composite above the transition temperature and in the low thermal conductivity phase during step (a);

the electric heater is off and the heat sink cools the polymer composite below the transition temperature during step (b); and the heat sink maintains the polymer composite below the transition temperature and in the high thermal conductivity phase during step (c).

14. The method of claim 12, wherein:

the component is an edge ring assembly including an edge ring and a heater ring in direct thermal contact with the edge ring;

the thermal source is a heat sink;

the heater ring heats the edge ring and maintains the polymer composite above the transition temperature and in the low thermal conductivity phase during step (a);

the heater ring is off and the heat sink cools the polymer composite below the transition temperature during step (b); and the heat sink cools the edge ring and maintains the polymer composite below the transition temperature and in the high thermal conductivity phase during step (c).

15. The method of claim 12, wherein the component is an upper electrode, a backing plate, a chamber wall, an edge ring and a substrate support layer.

* * * * *